United States Patent [19]

Matsuura et al.

[11] Patent Number: 5,394,148
[45] Date of Patent: Feb. 28, 1995

[54] AD CONVERTER

[75] Inventors: Tatsuji Matsuura; Imaizumi Eiki, both of Tokyo; Kunihiko Usui, Asaka; Takanobu Anbo, Fuchu, all of Japan

[73] Assignees: Hitachi, Ltd.; Hitachi VLSI Engineering Corp., both of Tokyo, Japan

[21] Appl. No.: 26,038

[22] Filed: Mar. 4, 1993

[30] Foreign Application Priority Data

Mar. 4, 1992 [JP] Japan .................. 4-046539

[51] Int. Cl.⁶ .............................................. H03M 1/42
[52] U.S. Cl. ..................................... 341/162; 341/161; 341/156
[58] Field of Search ............... 341/162, 156, 161, 172, 341/139, 166, 167, 168, 157, 145, 155

[56] References Cited

U.S. PATENT DOCUMENTS 4,672,361 6/1987 Kokubo et al. .
4,999,631 3/1991 Sugimoto ............................. 341/156
5,138,318 8/1992 Matsuzawa .......................... 341/156
5,159,342 10/1992 Yotsuyanagi ....................... 341/161

OTHER PUBLICATIONS

"Session XVII; Analog Techniques', IEEE International Solid–State Circuits Conference", 1987, Stephan et al, pp. 210–211.

*Primary Examiner*—Sharon D, Logan
*Attorney, Agent, or Firm*—Fay, Sharpe, Beall, Fagan, Minnich & McKee

[57] ABSTRACT

A high speed, accurate AD converter operable at low supply voltage, even with low gain amplifiers, particularly for a serial-parallel or pipelined AD converter, has a sub AD converter in each block of the second and subsequent stages provided with an adjuster for adjusting the full scale reference voltage in accordance with the gain of the error amplifier of the preceding stage. Analog switches are rendered immune to low operating voltage by being supplied separate voltage higher than the supply voltage of the other components in their circuit.

21 Claims, 11 Drawing Sheets

AD CONVERTER

BACKGROUND OF THE INVENTION

In the past, analog to digital conversion has been provided by a serial-parallel and a pipelined AD converter to accomplish high-speed, high resolution analog to digital conversion. An example of a pipelined AD converter of this type has been introduced in Lewis, Stephan H. et. al., "SESSION XVII: ANALOG TECHNIQUES', IEEE International Solid-State Circuits Conference", 1987 pp. 210–211.

Unlike a parallel AD converter, both the serial-parallel and the different pipelined converter are each designed to obtain the results of AD conversion by steps or stages, each of one or several bits. Each stage employs only some, but not all, of the voltage comparators necessary for the resolution, so that only a part of the voltage comparators are being used at one time in one of several blocks constituting the stages. Each block includes a sub AD converter. In the high order block, there is AD conversion of a high order bit accomplished coarsely by the high order block sub AD converter. In subsequent blocks of subsequent stages, the coarseness of the high order bit is sequentially reduced by a lower order bit obtained by a corresponding sub AD converter in the lower order block, which process is continued for subsequent stages according to the desired resolution.

In such a pipelined AD converter, the number of comparators is substantially reduced and the power consumption is substantially reduced in comparison with a parallel AD converter, Which parallel AD converter is burdened with a large number of voltage comparators. For this reason, the pipelined AD converter is particularly well suited for high-speed and high resolution.

SUMMARY OF THE INVENTION

It is an object of the present invention to analyze AD converters, particularly to identify and understand problems and their causes, and to provide solutions to such problems.

With reference to FIG. 2, the principle of a converter of the type employed by the present invention will be described and analyzed. As mentioned, a serial-parallel or pipelined AD converter has a number of stages, each stage having a block for AD conversion. In FIG. 2, there is disclosed a pipeline converter. If stage block 2 were eliminated, a serial-parallel converter would be disclosed. In FIG. 2 a first block 1 is used to carry out the AD conversion of a high order bit m as an output and to simultaneously create a signal known as a first stage residue signal RS1 as an output. The block 1 receives an analog signal AS that is converted into the digital high order bit m by the m-bit sub AD converter 1-1 that outputs the digital high order bit m. Subsequently, a m-bit DA converter 1-2, or first stage DA converter, receives the m-bit digital signal and converts it to an analog signal provided as the output of the m-bit DA converter 1-2. At this time, the analog signal output of the DA converter 1-2 is input to the first stage error amplifier 1-3 together with the original analog signal AS to generate a difference analog signal RS1 as the residue signal, which is a difference between the input analog signal AS and the regenerated analog signal from the DA converter. The error amplifier 1-3 amplifies this differential signal and outputs the same as the residue signal $RS_1$ to the next block 2-1 of the following stage. The residue signal $RS_1$ is a signal component left unconverted when the input analog signal as is coarsely digitized as the high order bit m. In other words, a portion of the analog signal AS has been digitized by bit m and the remaining portion of the analog signal AS is output as the residue signal $RS_1$ from the block 1 to be subsequently digitized in subsequent stages, with a number of subsequent stages being determined by the desired resolution. The second stage is substantially identical to the first stage 1, as are subsequent stages (not shown) although, as shown, the last stage does not need a DA converter or an amplifier.

If the above process is compared to mathematical division, the input analog signal AS (dividend) is digitized (divided) in the first stage to result in a value for the first stage bit (quotient) and a residue signal (remainder). The residue signal is the remainder of the particular stage, which remainder can be digitized in further stages (of division) to produce a lower order bit (additional digit of the quotient) for a number of stages (divisions) as determined by the desired resolution (accuracy of the division).

When the residue signal is digitized in a subsequent or next stage block, which with respect to FIG. 2 is the block 2, the sub AD converter 2-1 digitizes the residue signal RS in accordance with the full scale of the second stage to produce the lower order bit n. Thereby, the coarseness of the high order bit m can be further resolved by the next order bit n in the next stage having block 2. It is therefore the feature of this serial-parallel or pipelined AD converter that the conversion is at high speed with high resolution and only uses a few comparators as compared to the different parallel AD converter.

In the past, particularly in the case of CMOS or BiC-MOS AD or DA converters using conventional switched amplifiers and comparators, the supply voltage that has been applied from the outside of the AD converter has been used directly as the voltage supply to an analog switch. This has been true not only with respect to pipelined AD converters but also with respect to parallel and serial or subrange AD converters.

In the conventional serial-parallel or pipelined AD converter, importance has been placed on the accuracy and operating speed of the error amplifier for generating the differential signal, and therefore it has been necessary to provide high-gain, high-speed amplifiers as the error amplifiers of the stages. It is determined that the problem with this conventional pipelined AD converter is that the supply voltage makes it impossible to provide such a high-gain, high-speed amplifier.

In AD and DA converters, using conventional switch amplifiers and comparators, the supply voltage of an analog switch is directly ,employed. In both of these cases with the external supply voltage being directly employed, full scale resolution for AD conversion is not employed and it is impossible to bring the supply voltage down sufficiently to match the actual signal range in order to provide for full scale resolution, because to bring down the supply voltage would cause the analog switch to fail in operating at the lower voltage.

In addition to the object of analyzing AD converters, their problems and causes for such problems as has been done above, it is a further object of the present invention to overcome such problems, particularly by providing a high-speed, accurate AD converter capable of operating at a low supply voltage to improve resolution.

A particular embodiment of the present invention is of a serial-parallel or pipelined AD converter having a sub AD converter in each block for each stage, with the second and subsequent stages having means for adjusting the full scale voltage and high voltage for analog switches.

BRIEF DESCRIPTION OF THE DRAWINGS

Further objects, features and advantages of the present invention will become more clear from the following detailed description of a preferred embodiment, with variations and modifications, as shown in the accompanying drawing, wherein.

DETAILED DESCRIPTION

Figure 1:
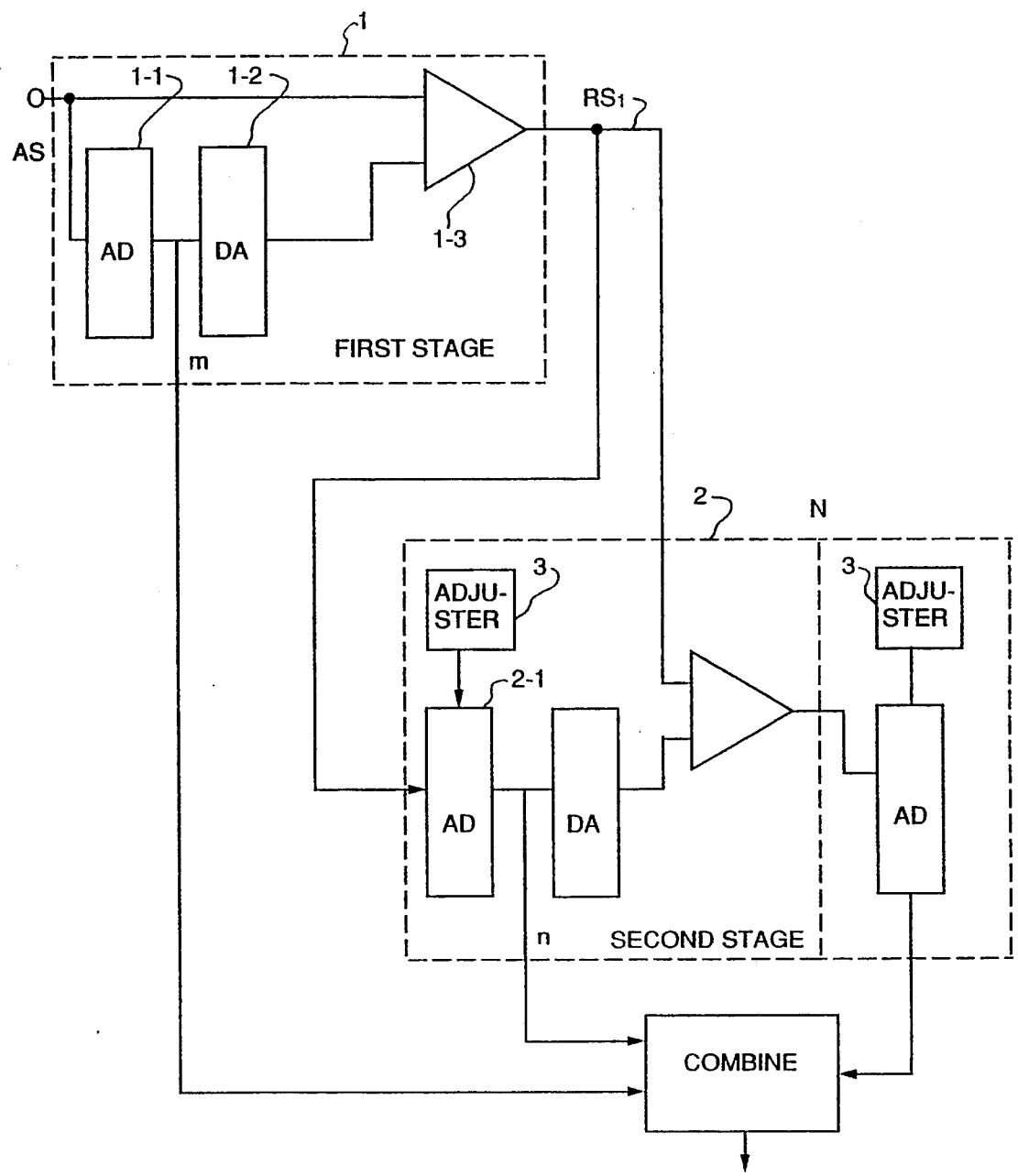
FIG. 1 is a block diagram of an error correcting AD converter embodying the present invention.

Many of the above figures may be referred to as drawings showing the circuit of another figure in more detail. Further, the basic configuration, for example as shown in FIG. 1, of the present invention, may take on many forms such as those shown in the other figures, with many times the details of the other figures being employable together in FIG. 1. That is, FIG. 1 is a starting point for the present invention and the remaining figures are merely further details of portions of the FIG. 1 preferred embodiment. As a specific example, the DA converter of FIG. 17 may be used as the DA converter of FIG. 1 along with other details of FIG. 1 as shown in other figures of the drawing. In the drawings, like numerals refer to like parts and broadly illustrated components in one figure include the details of the same component as shown in other figures wherein they are broadly referred to by the same numeral.

OVERVIEW

Figure 2:
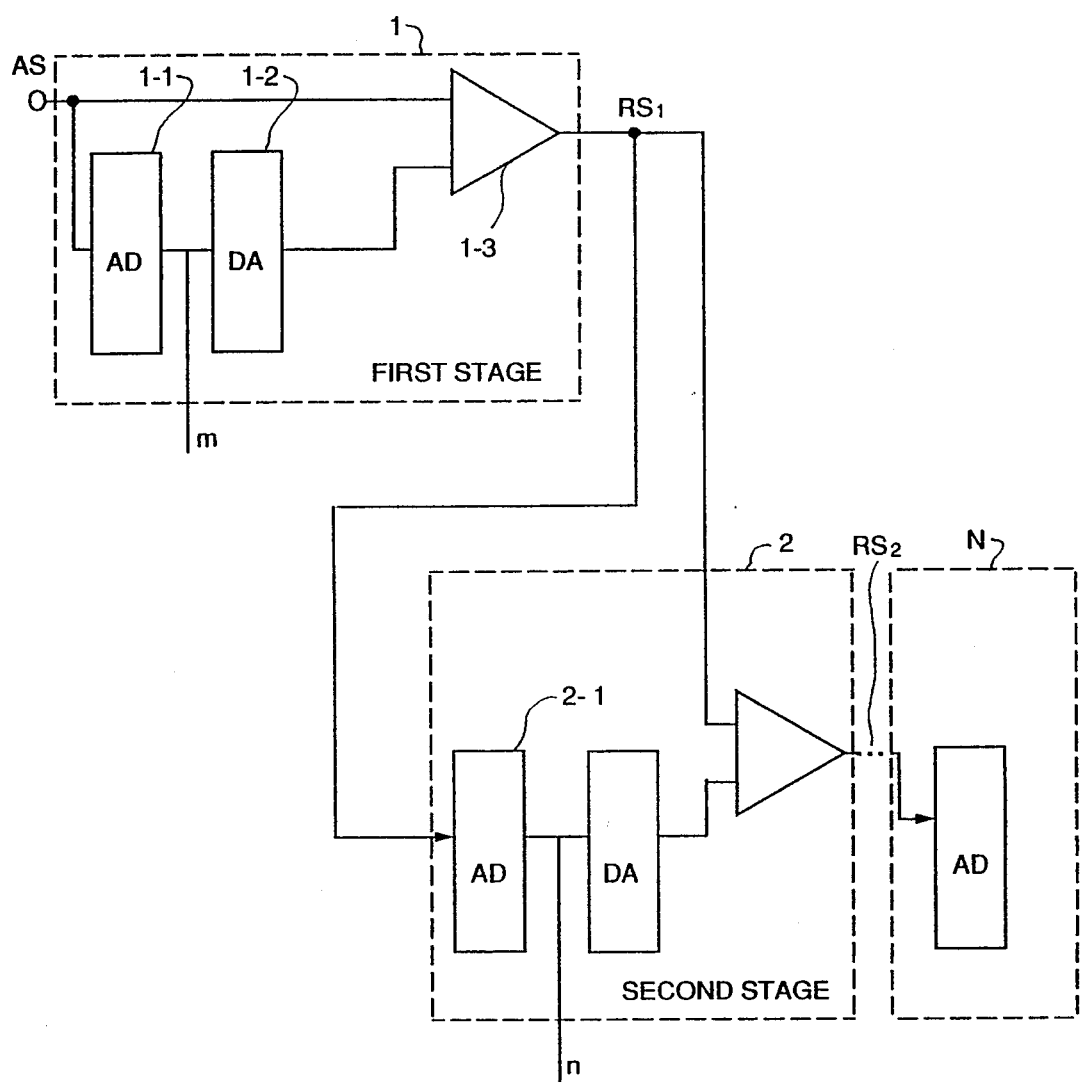
FIG. 2 is a generalized block diagram of a pipelined AD converter useful for analyzing principals employed in the present invention.

In accordance with the present invention, the basic serial-parallel or pipelined AD converter of FIG. 2 is additionally provided with an adjuster 3 in each of the second and subsequent stage blocks as shown in FIG. 1. The adjuster 3 adjusts the full scale voltage of the sub AD converter, for example the sub AD converter 2-1 in block 2 for the second stage.

The adjuster for adjusting full scale voltage is provided with a full scale adjusting amplifier for generating and supplying the voltage across the output of the amplifier to both ends of a resistor string, for example the resistor string 3-3 of FIGS. 7-10 with the scale adjusting amplifier circuit including scale adjusting amplifiers 3-1, 3-2. Preferably, the scale adjusting amplifiers 3,1 and 3-2 are identical to or have the same relevant characteristics as the error amplifier 1-3 of the previous stage. The scale adjusting amplifiers 3-1 and 3-2 provide voltage to a plurality of terminals of the voltage divider 3-3, particularly the resistor string 3-3 to provide voltage steps as reference voltages in the sub AD converter in each of the second 2 and subsequent blocks 3-N of the second and subsequent stages, that is all stages downstream of the first block 1, for example as shown in FIGS. 7-10 for the second stage.

Figure 5:
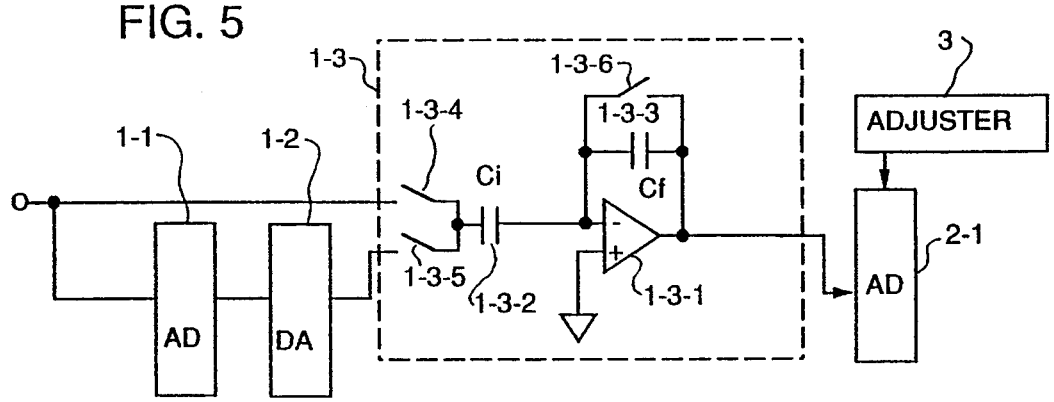
FIG. 5 is a block diagram of another error correcting AD converter using a switched capacitor amplifier and embodying the present invention.
Figure 6A:
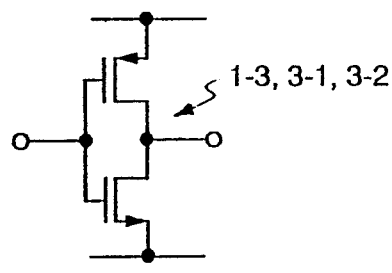
FIGS. 6A-6E are diagrams of various low gain amplifiers that may be used in the switched capacitor amplifier according to the present invention.
Figure 6B:
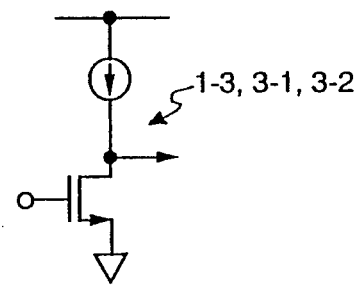
Figure 6C:
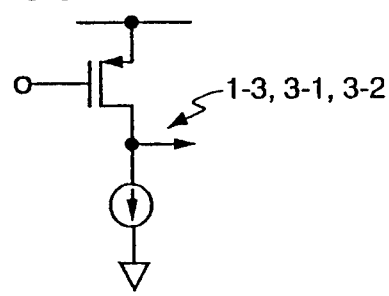
Figure 6D:
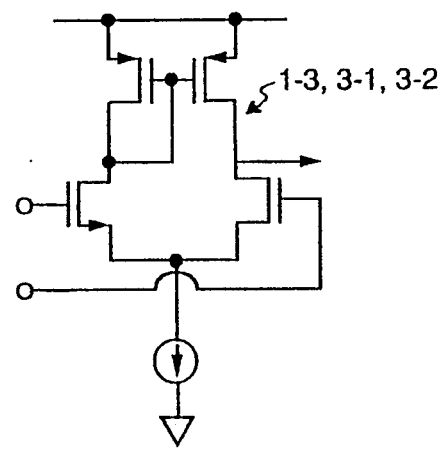
Figure 6E:
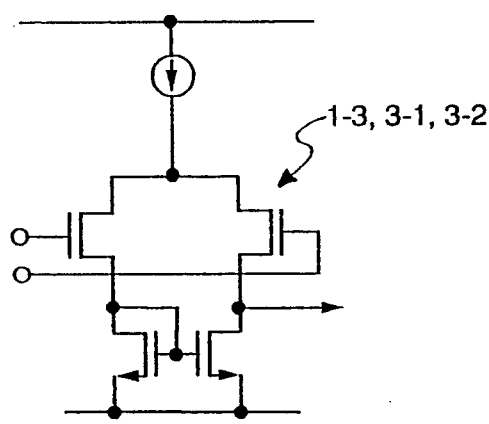
Figure 8:
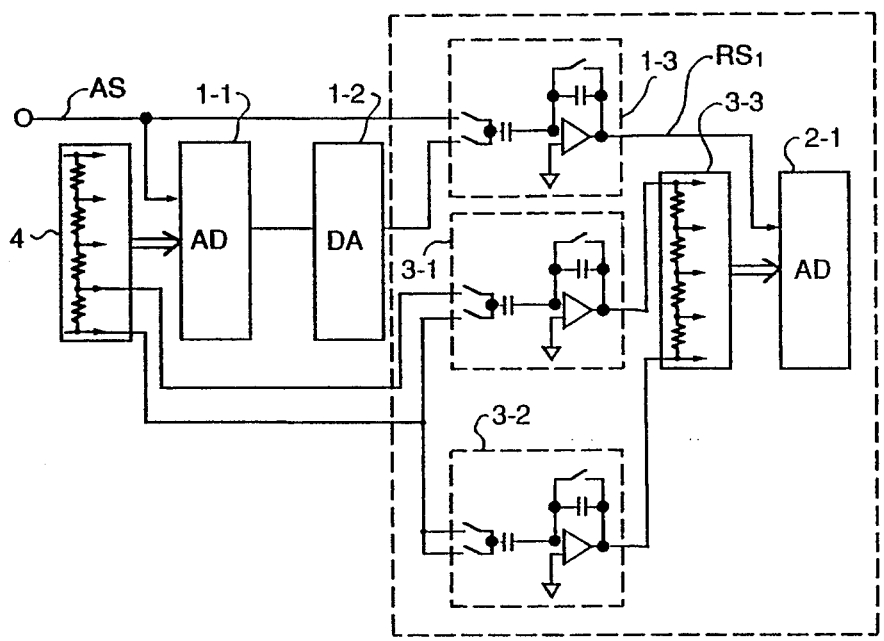
FIG. 8 is a diagram illustrating a full scale/offset adjusting circuit used in the present invention.
Figure 9:
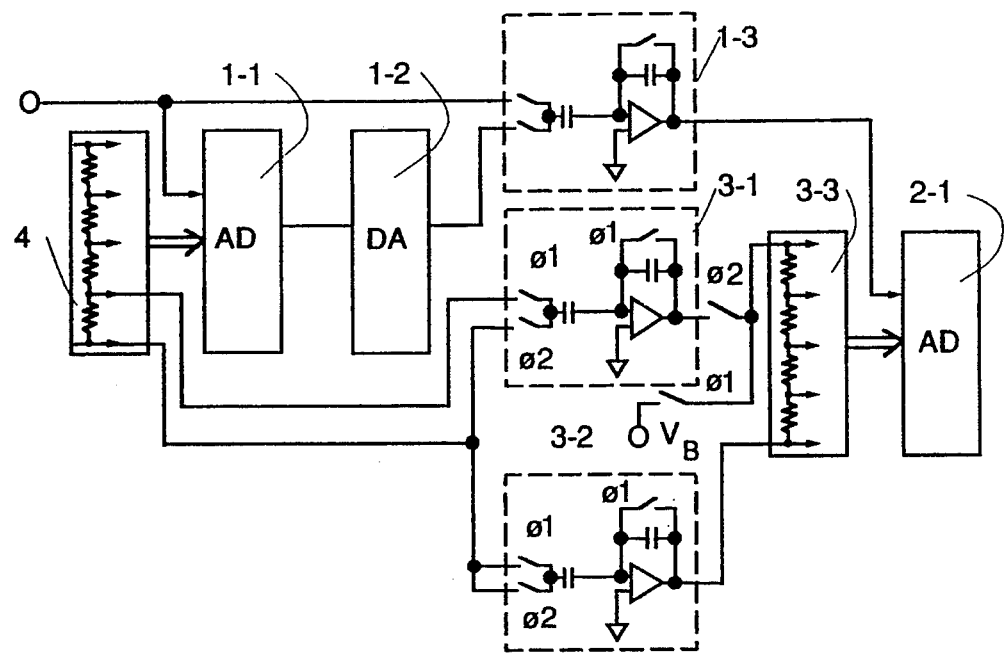
FIG. 9 is a detailed diagram of a full scale/offset adjusting circuit according to the present invention.
Figure 10:
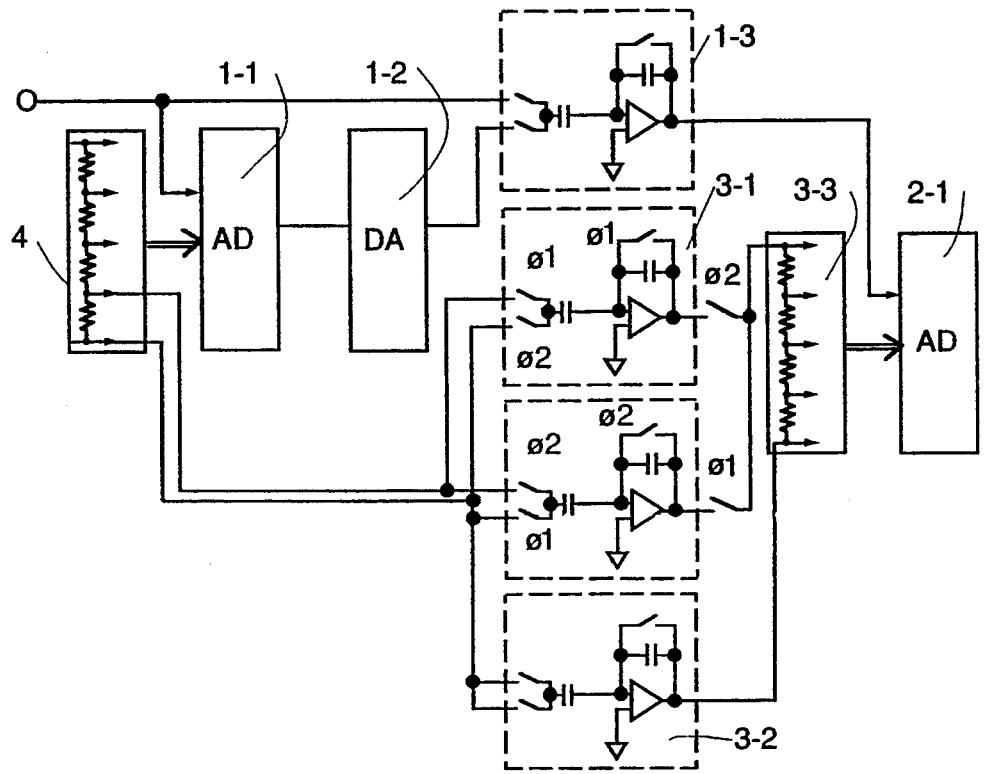
FIG. 10 is a detailed diagram of a full scale/offset adjusting circuit according to the present invention.

As shown in FIG. 5, the error amplifier 1-3 and as shown in FIGS. 8-10, the adjuster amplifiers 3-1 and 3-2 may be switched capacitor amplifiers, employing switches 1-3-6, 1-3-4, 1-3-5 and capacitors 1-3-3, 1-3-2. That is switched capacitor amplifiers may be used for the error amplifier of all of the stages and used as the full scale adjusting amplifiers for the second and subsequent stages, which provides an AD converter that has excellent linearity and excellent gain accuracy. Instead of a switched capacitor amplifier, a CMOS inverter amplifier may be used as shown in FIG. 6, (A)-(E), for example. In FIGS. 6, (B)-(E) the inverter amplifier is connected to a constant current source load, by way of example.

The full scale adjusting amplifiers, for example 3-1 and 3-2 may be provided with reset control for supplying voltage equal or close to full scale voltage as the reset voltage of the upper end of the resistor string 3-3 at each of the second and Subsequent stages, for example as shown in FIGS. 9 and 10.

Figure 11:
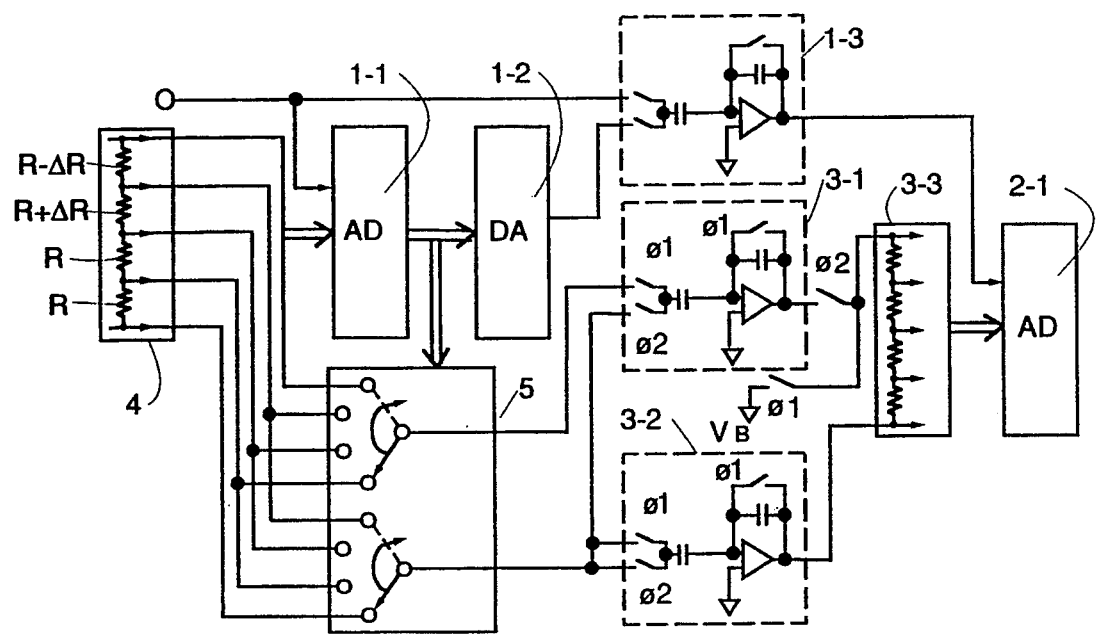
FIG. 11 is a detailed diagram of a full scale/offset adjusting Circuit according to the present invention.

The full scale adjusting amplifiers may further be provided with a switch circuit so that full scale input voltage is obtained by the adjusting amplifiers by switching the voltage across the terminals of the resistor string 3-3 at the preceding stage, as shown in FIG. 11, for example. This structure is preferred because the proper full scale voltage can be generated even though the divided voltage is rendered uneven by variation in the value of the resistor string at the preceding stage.

Figure 12:
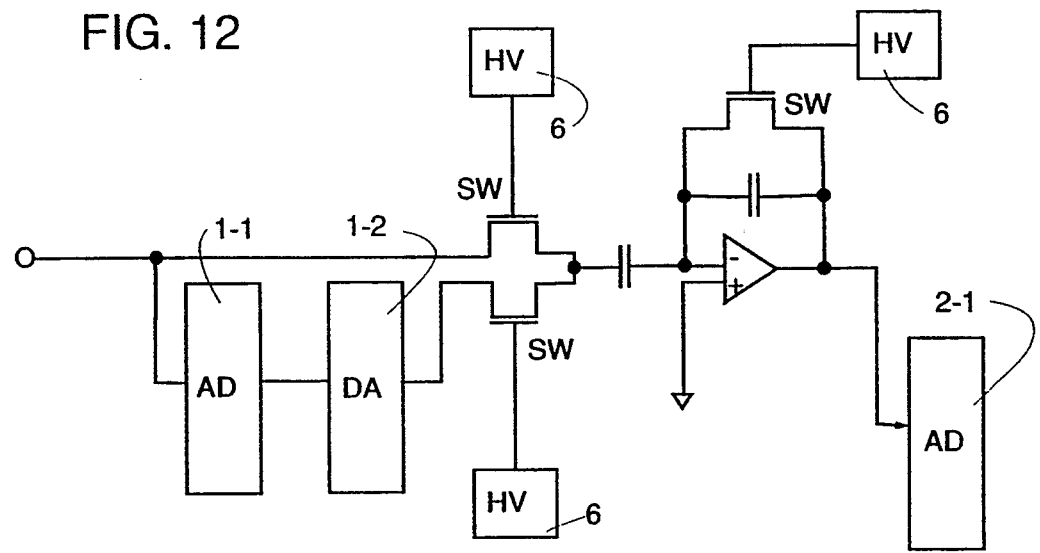
FIG. 12 is a diagram of a low voltage AD converter using a high voltage for a Switch according to the present invention.

In FIG. 12, the AD converter uses a switched capacitor amplifier with a high voltage switch. A high voltage clock 6 provides high voltage for driving an analog switch SW, which high voltage is higher than voltage supplied to any other component in the AD converter. Therefore, the operating speed of the analog switch SW is increased even though the supply voltage for the other components is lower than the value of the voltage for the voltage source or high voltage clock 6. This high voltage driving of the analog switches of FIG. 12 may be used in the circuits of the other figures.

Figure 13:
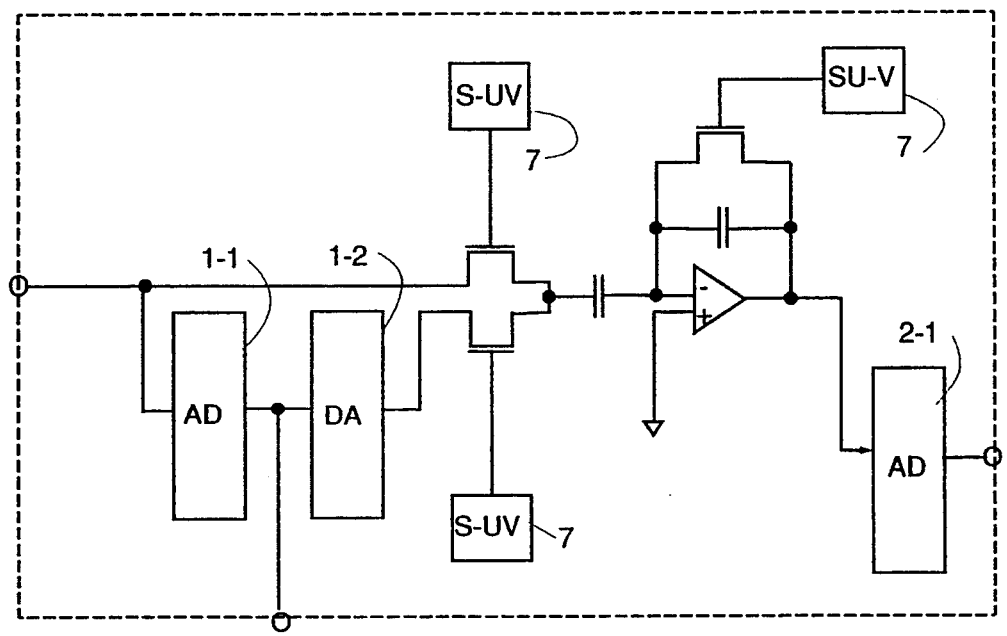
FIG. 13 is a diagram of a low voltage AD converter using a step-up voltage for a switch according to the present invention.

In FIG. 13, the AD converter uses a switched capacitor amplifier that is provided with a step-up voltage from a step-up voltage clock S-UV, 7. Thereby, the output voltage of the step-up circuit is utilized for driving the analog switches, with improvements similar to those obtained in FIG. 13. FIGS. 12 and 13 show only the analog switches associated with the input for the second stage AD converter 2-1, and it is to be understood they are equally applicable to subsequent stages and equally applicable to full scale adjusting voltage amplifiers 3-1 and 3-2 of the second and subsequent stages.

Figure 14:
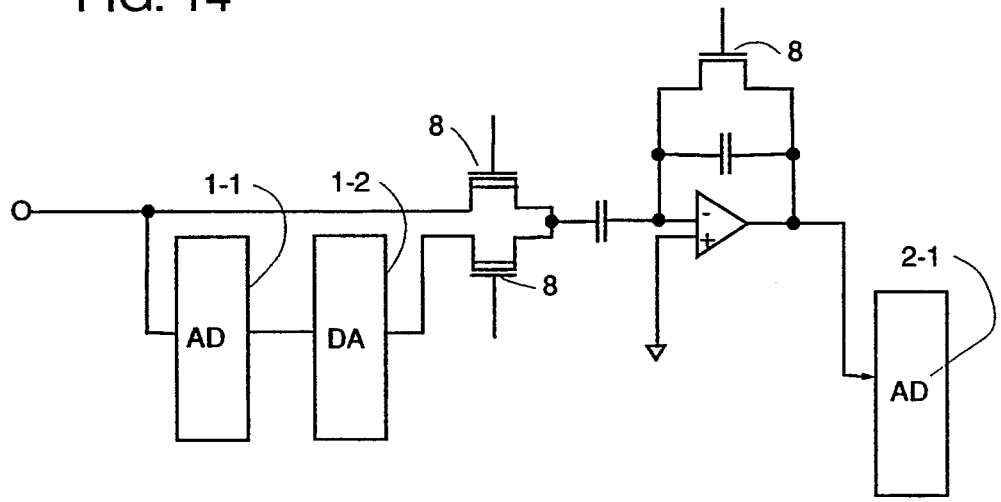
FIG. 14 is a diagram of a low voltage AD converter using a low threshold voltage transistor according to the present invention.

As shown in FIG. 14, a MOS transistor may be used as the analog switch in any of the other figures. The MOS transistor 8 has a threshold voltage that is lower than other transistors that may otherwise be used as the analog switch, which has the result of increasing the operating speed of the analog switch.

Figure 15:
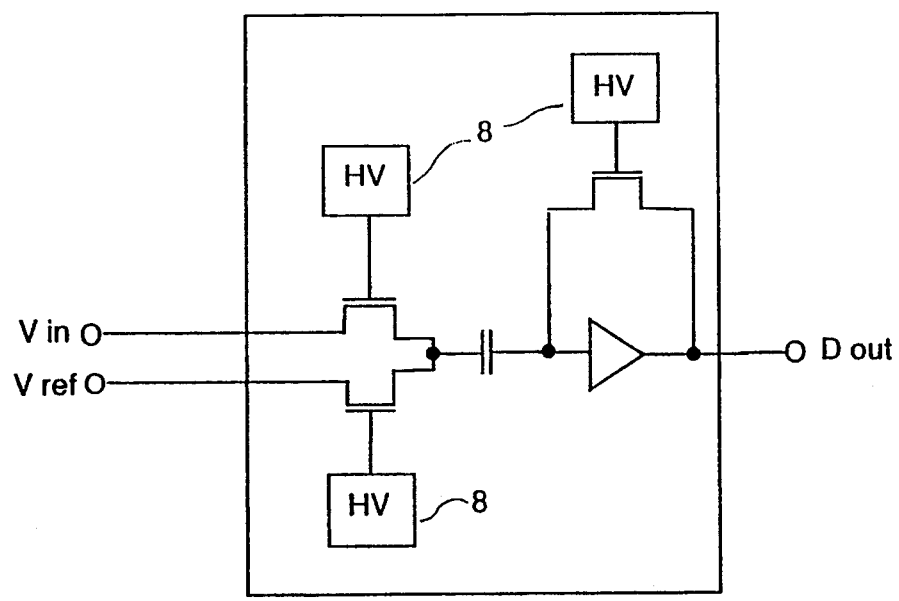
FIG. 15 is a diagram illustrating a switched capacitor comparator circuit using a high voltage clock circuit, a step-up clock circuit or a low threshold voltage transistor for the power supply of a switch.

FIG. 15 shows a low voltage switched capacitor circuit as a comparator, which uses a high voltage clock HV for the analog switches. Increased voltage for driving the analog switches in a comparator has general application beyond the preferred combination of an AD converter. FIG. 15 shows such a general application, that would be useful in other circuits than an AD converter. The boosted supply voltage for low threshold voltage transistors may be utilized for not only analog switches of error amplifiers in pipelined AD converters, but also general purpose comparators using analog switches, as shown in FIG. 15. Such applications are of practical use for keeping the voltage of the comparator at a low level. Therefore, voltage may be maintained low for not only comparator circuits but also AD converters of parallel, serial, subrange CMOS or BiCMOS using analog switches or DA converters using analog switches and further switched capacitor circuits in general. Vin is an input voltage, Vref is a reference voltage, which voltages are compared, and Dout is a digital output as the result of such comparison.

The sub AD converter in each block at the second and all following stages of the serial-parallel or pipelined AD converter of the present invention is provided with the adjuster 3 for adjusting full scale voltage to regulate and correct the full scale voltage in such a way as to obviate an error signal generated by the lack of gain of the amplifier at the first and following stages. As a result, a high gain is not necessarily required for the error amplifier, as in the past, with the effect of making the required supply voltage lower.

The adjuster for adjusting full scale voltage generates full scale voltage from the resistor string 3-3 of the reference voltage generator at the preceding stage with the same type of amplifier, particularly the same type of switched capacitor amplifier as the error amplifier 1-3. Therefore, a conversion error is inevitably prevented even though a low gain amplifier is used for the error amplifier. Even when the gain of the error amplifier changes as process parameters fluctuate, no conversion error occurs since the full scale voltage obtained with an identical amplifier also changes or fluctuates in the same way at the same time that the amplitude of the error signal changes. Consequently, a particularly high-gain amplifier was not required with the present invention and instead a lower power supply is provided to compensate for the use of the lower gain amplifier without a loss in performance.

Even though the external supply voltage is low as provided by the adjuster, analog switches associated with the same stage may be driven by a separate high voltage, or alternatively a low threshold transistor may be employed as the analog switch. Thus, with either a high voltage supply for the analog switches or the use of low threshold voltage transistors for the analog switches, there is no problem with the switch not turning on when the supply voltage is lowered by the adjuster.

Further, when a switched capacitor amplifier is used for the error amplifier and the adjuster amplifiers, accurate conversion is obtainable because linearity and gain accuracy are higher than in the case where a resistance amplifier is employed. Thus, there is an advantage to the use of a switched capacitor amplifier, even though many aspects of the present invention may be employed with amplifiers other than the switched capacitor amplifier.

DETAILS

Accordingly, serial-parallel or pipelined AD conversion can accurately be obtained at high speed. Though an overview has been provided, further details will be set forth as follows.

In FIG. 1, the AD converter 2-1 of the second stage is provided with an adjuster 3 for full scale reference voltage adjusting. Thereby, even if the input analog signal full scale at the second stage has changed as the performance of the error amplifier 1-3 changes (normally unsatisfactorily so), no conversion error is produced because the adjuster 3 correspondingly adjusts the full scale reference voltage. Although only stages 1, 2,... N of sub AD converters 1-1, 2-1, ..., N-1 have been shown in the Figures, it is understood that the AD converter may have more than two stages, with the intermediate subsequent stages being substantially identical to the second stage, as is known in the construction of a pipelined AD converter, and in accordance with the present invention each second and subsequent stage is provided with an adjuster 3 for full scale adjusting of the sub AD converter reference voltage to prevent the conversion error. The adjuster 3 may be also considered a voltage offset adjuster.

Figure 3:
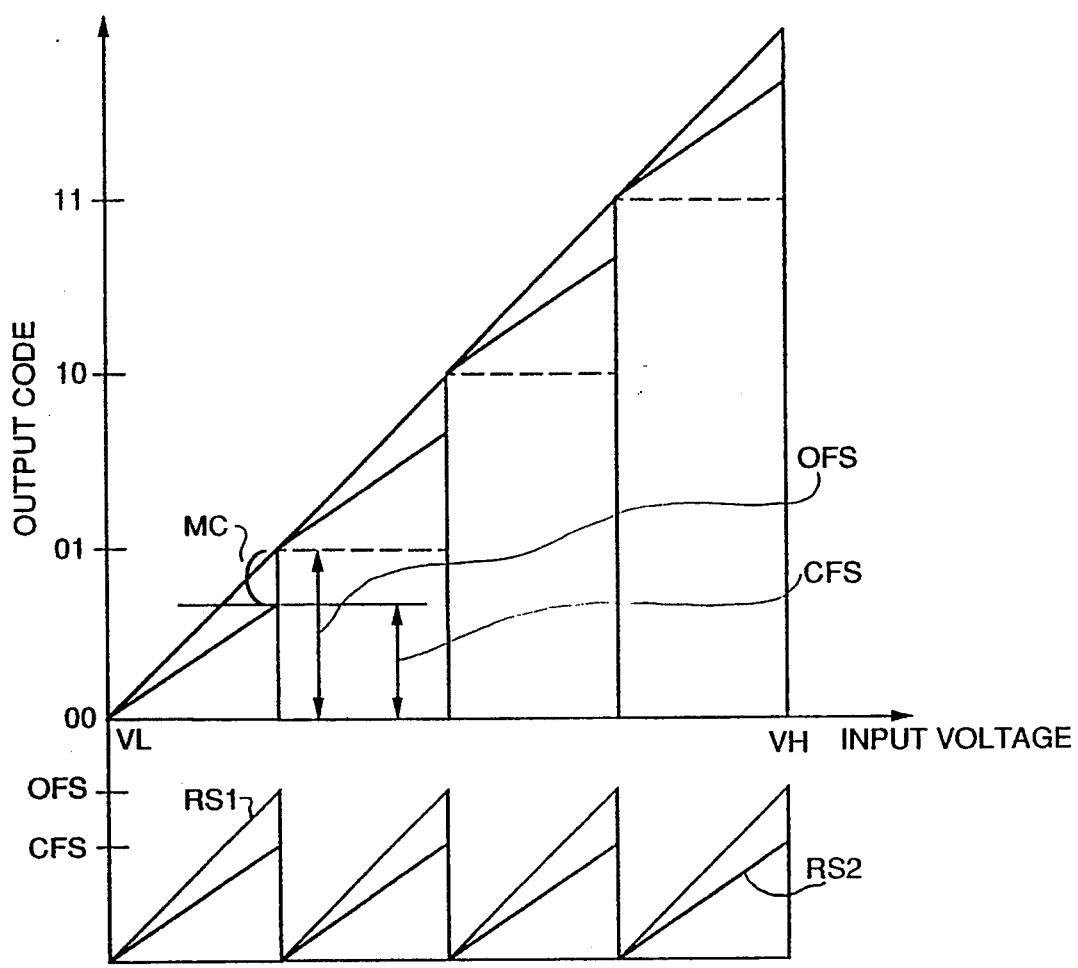
FIG. 3 is a diagram illustrating the present invention analysis of conversion error resulting from gain error of an amplifier in an AD converter generally of the FIG. 2 type.

FIG. 3 is useful in analyzing and understanding the conversion error that is found to exist when the adjuster 3 is not used and the error amplifier has a finite or low gain, which has briefly been mentioned above. Even though the waveforms have been illustrated with straight lines, by convention, they in fact are stepped. FIG. 3 shows synchronized wave forms produced with respect to an AD converter at the first stage, which first stage is capable of two-bit resolution to divide the full scale of input analog voltage into four parts (two bit resolution having four possible values).

Figure 7:
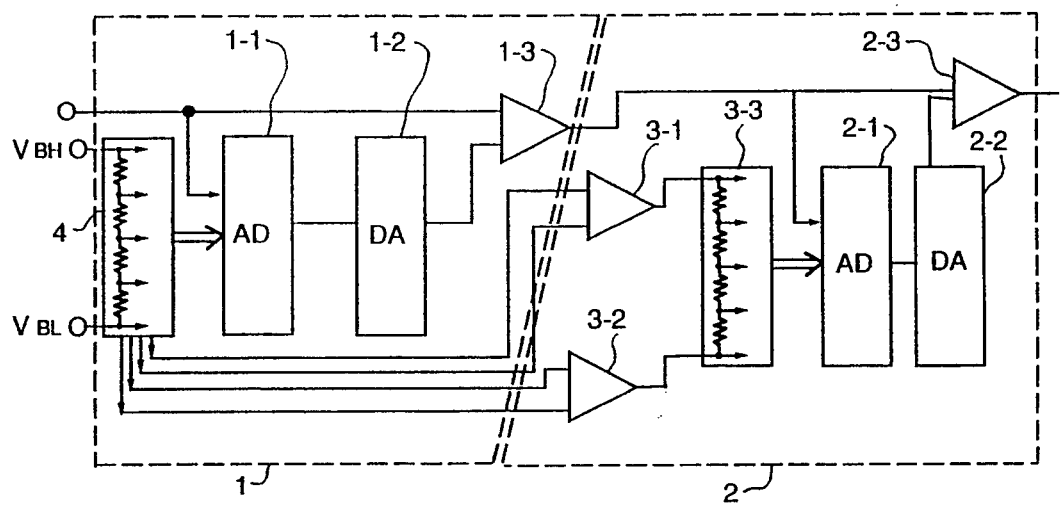
FIG. 7 is a diagram of a low gain amplifier as used in the switched capacitor amplifier according to the present invention.

As shown in FIGS. 7 or 8, for example, the adjuster 3 is provided with full scale adjusting amplifiers 3-1, 3-2 for generating the full scale reference voltage by supplying the output voltage of the amplifiers respectively at both terminal ends of a voltage divider 3-3, which is specifically a resistance string. The resistance string 3-3 provides the four reference values of voltages needed to obtain the two bit resolution of the analog signal RS1, provided from the error amplifier 1-3, within the sub AD converter 2-1 of the second stage block 2. In the illustrated switched capacitor amplifier type used for the error amplifier 1-3 and the adjuster amplifier 3-1, 3-2, a switch and a capacitor, as shown, are used respectively for the error amplification and the full scale adjusting amplification, to thereby obtain an AD converter that has excellent linearity and excellent gain accuracy.

A CMOS inverter may be used for the switched capacitor amplifier as shown in FIG. 6. The inverter amplifier can use a constant current source load as shown in FIGS. 6B–6E, for example. The adjuster 3 may be provided with a reset for supplying voltage equal to or close to full scale voltage as a reset voltage for the upper end of the resistor string 3-3 for the second and subsequent stages, for example as shown in FIGS. 9 and 10.

The adjuster may be provided with a switch circuit so that input reference voltage is obtainable in the full scale for the sub AD converter in the second and subsequent stages for two bit resolution by dividing the reference voltage full scale into four parts, for example by the voltage divider or resistor string 3-3. The first block 1 generates residue signal RS1 as a differential signal between the input analog signal and a regenerated analog signal that has been subjected to two bit resolution. That is, the input analog signal AS would be digitized to produce a two bit coarse digital value for the four voltage divisions, the residue signal passing to a block of a second stage, and this division would be repeated for the number of stages involved to obtain the desired resolution or accuracy.

The residue signal is shown at the bottom of FIG. 3 for one of the voltage divisions, which residue signal is then sent to a block of a subsequent stage. The residue signal, as shown in FIG. 3 may be of two forms, for example RS1 that would be produced by a high gain amplifier and RS2 that would be produced by a low gain amplifier or a high gain amplifier that has deteriorated. The residue signal is the amplified differential between the input signal AS and the regenerated analog signal that has been subjected to two bit AD conversion. It is thereby seen that as the gain of the amplifier 1-3 for producing the residue signal is low or finite, the value of the residue signal will be RS2 and not reach the full scale value OFS and instead will only reach the smaller value CFS. Due to the difference between OFS and CFS in the residue signal, that is the difference between the maximum amplitude for RS1 and RS2, there tends to be an error in the conversion, which will produce an area of missing code MC for the sub AD converter at the second stage. With a plurality of stages, the growth of the conversion error is increased in accordance with a number of stages. It is an object of the present invention to avoid the missing code area and thus avoid error and particularly the propagation of error through a plurality of stages wherein the error would grow.

In accordance with the present invention, to prevent the missing code area MC, the adjuster 3 adjusts the full scale of voltage, at the second stage, used as a reference for the second stage sub AD converter from OFS to a reduced voltage or smaller full scale voltage CFS to correspond with the smaller scale CFS of the residue signal RS2. The reduction from OFS to CFS for the residue signal RS2 is caused by insufficient gain of the error amplifier for amplifying the residue signal in the preceding stage. According to the present invention, the same type of amplifier is used for amplifying the reference and residue signal voltage to correspondingly produce the same amplification of the reference voltage and residue signal to produce a correspondingly reduced reference full scale voltage, for use by the subsequent sub AD converter in converting the residue signal.

Figure 4:
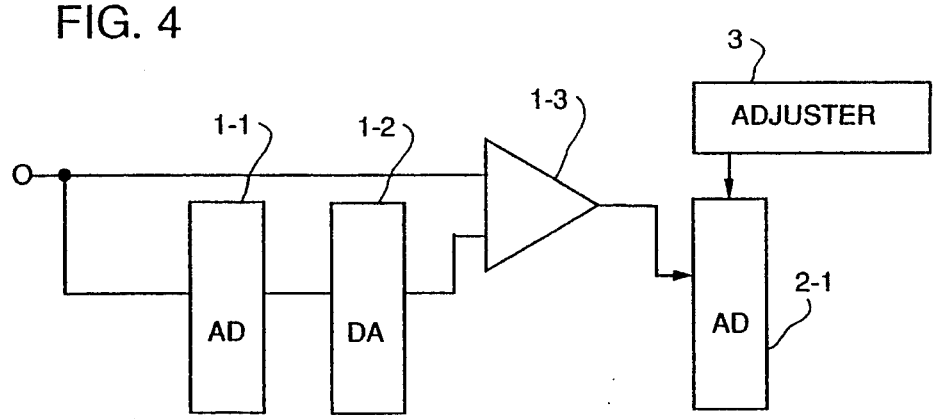
FIG. 4 is a block diagram of an error correcting AD converter using a low gain amplifier and embodying the present invention.

FIG. 4 broadly has the same components as FIG. 1. In FIG. 1, a high gain amplifier 1-3 is used, which may fluctuate or deteriorate to produce the low gain, as analyzed in FIG. 3. The same results as analyzed in FIG. 3 may be obtained with the configuration of FIG. 4, wherein a low gain amplifier 1-3 is employed. In FIG. 4, like FIG. 1, no conversion error is produced even though the gain of the error amplifier is low or finite, because of the adjuster 3 adjusting the reference full scale voltage to correspond to the full scale of the residue signal, for the subsequent stage 2. An advantage of the FIG. 4 structure over that of FIG. 1, is that a low gain amplifier may be used for the error amplifier, without producing an error in the final output of the AD converter.

In FIG. 5, the amplifier 1-3 is shown in more detail as it is used in either FIG. 1 or FIG. 4. Specifically the error amplifier 1-3 in each stage is a switched capacitor amplifier. In this amplifier, a feedback capacitor Cf, 1-3-3, is connected between an input terminal and the output terminal of a differential amplifier 1-3-1 in parallel with a reset switch 1-3-6. One end of an input capacitor Ci, 1-3-2, is connected to the one input terminal of differential amplifier 1-3-1 and the other end is connected to an input switch 1-3-4 connected to the stage input analog signal and to a switch 1-3-5 connected to the output of the DA converter 1-2 of the same stage. The differential amplifier 1-3-1 operates during a reset period and an amplifying period as follows. The reset switch 1-3-6 short-circuits the input and output of the amplifier 1-3-1. When the input switch 1-3-4 is then turned on, the input signal directed to the AD converter 1-1 is sampled at the input side of the input capacitor Ci simultaneously with closing the reset switch 1-3-6. When the switches 1-3-4 and 1-3-5 are respectively turned off and on after the reset switch is turned off to make the amplifier 1-3-1 operable during the amplifying period, the voltage at the amplifier side of the input capacitor 1-3-2 changes from the voltage of the input signal that has been held to the output voltage of the DA converter 1-2. This change is amplified at a ratio of Ci/Cf and becomes the output voltage of the amplifier 1-3-1. Error amplification occurs. The gain of the amplifier 1-3-1 should ideally be infinitely great. The gain of an error amplifier circuit is Ci/Cf, which may not be infinite and in case the gain of the amplifier 1-3-1 is finite, that is the gain of the amplifier 1-3-1 is low, which also may happen when the gain of the error amplifier circuit 1-3 will shift from the ratio of Ci/Cf. Consequently, no accurate full scale amplification is accomplished by only the amplifier 1-3. According to the present invention, the AD converter is free from conversion error overall because of the adjuster 3 adjusting the voltage reference for the subsequent sub AD converter 2-1 in correspondence with the inaccuracy of the full scale output from the error amplifier 1-3.

In the AD converter as shown in FIG. 5, the adjuster 3 eliminates the conversion error for the AD converter even when a low gain amplifier is employed as the amplifier 1-3-1.

FIG. 6 shows various examples of a low gain amplifier that may be! used as the amplifier 1-3-1 as well as the amplifiers 3-1 and 3-2 in the adjuster 3. FIG. 6A shows a CMOS inverter whose gain is generally as low as 10 to 30; FIG. 6B shows an nMOS input amplifier; FIG. 6C shows a pMOS input amplifier; FIG. 6D shows an nMOS input differential amplifier; and FIG. 6E shows a pMOS input differential amplifier. It is impossible to use the amplifiers of FIGS. 6A and 6B as an ordinary operational amplifier, because they are all low gain amplifiers. However, these low gain amplifiers of FIG. 6A-6E are usable in the operational amplifier of the present invention employing the adjuster 3, particularly in the AD converter provided with a full scale adjusting adjuster 3, which adjuster will decrease the reference voltage of a subsequent amplifier according to the full scale of the operational amplifier.

FIG. 7 shows further details of the adjuster 3 and the reference voltage input for the sub AD converter 1-1, which features are employed in the present embodiment although shown in greater or less detail in the other figures. The adjuster 3 for block 2 is provided with full scale adjusting amplifiers 3-1, 3-2 that have the same characteristics (e.g. gain, deterioration of gain) as the characteristics of the error amplifier 1-3, according to the present invention. The reference voltage steps used by the sub AD converter 1-1 of the first stage block 1 are determined by the voltage divider, which is preferably a resistor string 4 that receives fixed externally supplied bias voltage $V_{BH}$ and $V_{BL}$ at end terminals. The full scale of the reference voltage of the subsequent stage sub AD converter 2-1 is adjusted to conform completely to the full scale of the error amplifier of the previous stage AD converter 1-1, even if the gain is modified by deterioration, e.g. Therefore, there are provided two full scale adjusting amplifiers 3-1, 3-2 to amplify the voltage division of the resistor string 4 that is to be applied to the opposite ends of the resistor string 3-3 of the subsequent stage, whereby the full scale of the sub AD converter 3-3 at the next stage block 2 completely conforms to the divided voltage steps at the preceding stage 1 amplified with the same gain as the amplification of the residue analog signal of block, with the effect of preventing conversion error in the AD converter.

With respect to FIG. 7, it was said that the amplifier 3-1 and 3-2 should have the same characteristics as the error amplifier 1-3, with respect to the analysis of FIG. 1, which would include the amplifiers 3-1 and 32 being the same or same type as amplifier 1-3, or different types. In FIG. 8, there is illustrated a more specific detail of FIG. 7, wherein the amplifiers 3-1 and 3-2 are of exactly the same type or identical in construction to the amplifier 1-3, with respect to the structure of the full scale or offset adjusting circuit of the adjuster 3. In FIG. 8, the error amplifier 1-3 is the switched capacitor amplifier shown in FIG. 5. This amplifier operates during a reset period and an amplifying period as discussed with respect to FIG. 5. The same switched capacitor amplifier is used for the full scale adjusting amplifiers 3-1 and 3-2. A voltage difference in the divided voltage steps of the resistor string 4 the first stage 1 is applied to the input of the full scale adjusting amplifier 3-1 for determining the reference voltage, that is the upper terminal end voltage of the resistor string 3-3 for the sub AD converter 2-1 of the second stage 2. That is, the voltage difference is the voltage between two adjoining voltage divider terminals. Further, the inputs of the full scale adjusting amplifier 3-2 for determining the lower end voltage of the resistor string 3-3 for sub AD converter 2-1 at the second stage 2 are connected as shown to the resistor string 4. Thereby, the full scale adjusting amplifier 3-2 on the lower side generates the offset voltage. On the other hand, the full scale adjusting amplifier 3-1 on the upper side generates the full scale voltage obtained by multiplying one step of the preceding stage voltage divider relative to the offset voltage, in the same way as the error amplifier generates the residue signal, in terms of gain. As the offset voltage generated by the error amplifier can be compensated for by the adjuster, accuracy obtainable with this construction is superb.

In the present invention, the voltage on the upper side of the resistor string 3-3 at the second stage 2 is set at reset potential during the reset period and the proper voltage is supplied to the resistor string 3-3 during the amplifying period. When the voltage on the upper side of the resistor string fluctuates in this manner, it requires a time for the voltage of the resistor string to be stabilized while the reset period is changed to the amplified period. Therefore, no attempt to increase speed is possible.

In FIG. 9, a further detail of the adjuster 3 is shown, wherein the voltage at the upper end of the resistor string 3-3 of the second stage is connected to a bias voltage $V_B$ at reset, which bias voltage $V_B$ is close to the full scale voltage, with such connection being accomplished by a switch that is closed during the reset period $\phi 1$, whereas the upper end voltage is connected to the output voltage of the full scale adjusting amplifier 3-1 during the amplifying period $\phi 2$. With the additional feature of FIG. 9, high-speed operation becomes feasible as almost no time is required for the voltage of the resistor string to become stabilized. As seen, $\phi 1$ and $\phi 2$ represent the reset and amplifying periods, respectively, for interlocking operations among the switches, that is the indicated switches are closed during their respective periods and open at other times.

FIG. 9 employs the bias voltage $V_B$, which may be fixed, as is easily understood, or which may be adjustable, and FIG. 10 is a specific circuit example of how the reference voltage $V_B$ can be adjusted. In FIG. 10, an additional full scale adjusting amplifier, like each of the full scale adjusting amplifiers 3-1 and 3-2, is connected to provide an output. The output of the additional full scale adjusting amplifier is provided as the bias voltage switched during reset period $\phi 1$ to the upper terminal of the resistor string 3-3. In this way, the upper end voltage of the resistor string 3-3 is entirely prevented from changing between the reset period and the amplifying period with even higher speed obtainable than with a fixed bias voltage $V_B$.

FIG. 11 is similar to FIG. 9, but showing a further detail, which improves the differential linearity of the full scale adjusting amplifiers 3-1 and 3-2 (as well as the full scale adjusting amplifier for the bias voltage if used as in FIG. 10). When the divided voltage is not uniform among the divisions produced by the resistor string 4 at the first stage, because the value varies, there is a problem of differential linearity that would produce missing code (that is a particular step voltage is not produced). The full scale adjusting mechanism previously described further employs a voltage difference selector 5 between the output voltage divider of one stage and the adjuster of the succeeding stage, specifically between the resistor string 4 of the first stage and the full scale adjusting amplifiers 3-1 and 3-2 of the second stage adjuster 3. By way of example, the problem may be caused by the resistor string 4 having a lower voltage division of value R, next lower voltage division of value R, a next voltage division of R plus some change in resistance $\Delta R$ and the upper voltage division of value R-$\Delta R$. In general, the present invention is concerned with adjusting the reference voltage division from a preceding stage to be applied to the sub AD converter of a succeeding stage; more specifically circuits such as those of FIG. 9 and FIG. 10 pick a specific fixed one of the voltage divisions to be supplied to the next stage, whereas the selector 5 of FIG. 11 will pick only the one of the four (for example) voltage divisions of resistor string 4 that corresponds to the digital value of that stage to be amplified, divided and used as the reference voltage in the sub AD converter of the following stage that receives such reference voltage.

It is seen that in a configuration such as the circuit of FIG. 9, there is a disadvantage of providing the fixed one of the voltage division to the subsequent stage of block 2, whereas the selector 5 of FIG. 11 selects the corresponding one of the four voltage division values of voltage divider 4 for the second stage. Thus, FIG. 11 provides more accurate results when the voltage divisions in voltage divider 4 are not equal. In the example shown in FIG. 11, assuming the uppermost resistance value is smaller by $\Delta R$ and the next resistor value is greater by $\Delta R$ than the other two resistance values, the full scale of the sub AD converter at the second stage will correspondingly differ according to which voltage division of resistor string is selected the second stage. Therefore, the problem of a missing code that has arisen due to unequal voltage division of a preceding stage is solved with the selector 5 of FIG. 11. Therefore, the selector or switch 5 switches the lead out terminals of the resistor string of one stage, in accordance with the result of the sub AD conversion at the one stage, to be applied to the next stage. In other words, assuming the conversion of the first stage has indicated an input voltage existing between n and n+1 terminals of the resistor string 4, then the voltages at n and n+1 terminals are applied to the full scale adjusting amplifier of the next stage. As a result, there is no problem of missing code since the end-to-end voltage of the resistor string at the second stage will vary in accordance with the corresponding voltage division from the preceding stage that was used in the conversion, even though the voltage divisions in the preceding stage are not uniform.

Figure 18:
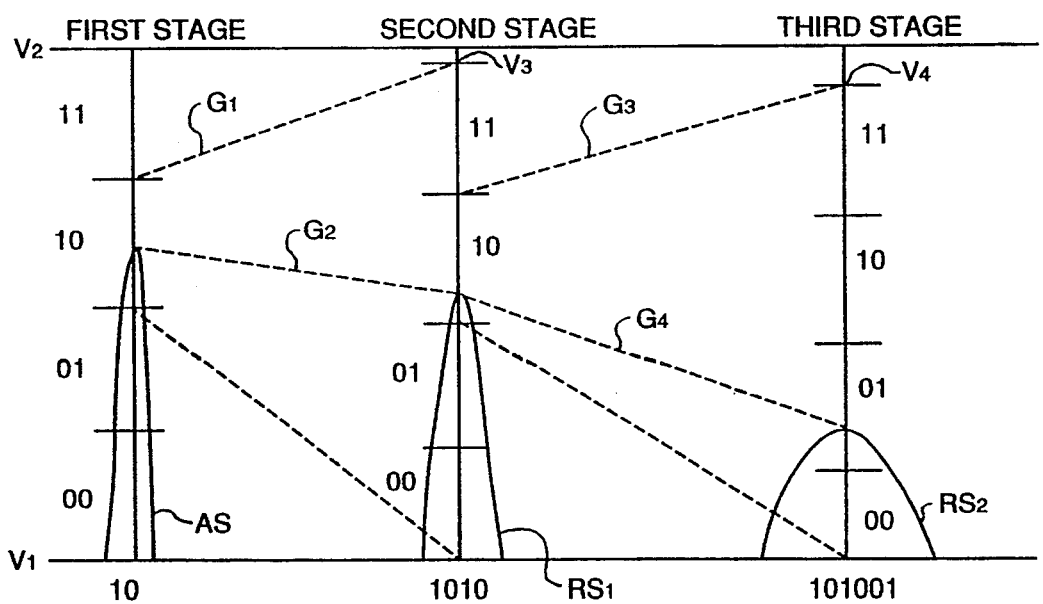
FIG. 18 is a reference voltage and analog signal diagram illustrating results of a pipelined AD converter using the present invention of FIG. 1 compared to using the converter of FIG. 2.

For example, with reference to FIG. 18 and FIG. 11, if the first stage determines a voltage for the analog signal AS is within the range of the second division from the top of the voltage divider resistor string 4, the sub AD converter 1-1 will provide a two bit output "10" as the high order bits of the sub AD converter, which two bits are then fed to the selector 5 to select the voltage division corresponding to the value R+$\Delta R$ as the value of the resistor string 4 to be passed through the adjuster 3 with gain G1 to the next stage and applied as the full range to the voltage string 3-3 to obtain reference voltage divisions for the AD converter 2-1. Residue signal is amplified as dashed line of $G_2$. The full range of reference voltage for the string of stage 1 is $V_2-V_1$ and that of stage 2 is $V_3-V_1$, which as shown is lower. At stage 2 the digital output is "10" as the next order bits. The second stage residue signal is amplified as dashed line of $G_4$ to provide a third stage digital output of "01" with reference voltage full range of $V_4-V_1$. However, note that if the third stage operated with a fixed reference voltage range $V_2-V_1$, as in FIG. 2, the digital output would be erroneous as "00". For the three stages, resolution by FIG. 11 is "101001" as compared to "101000" for FIG. 2.

As set forth above, accurate AD conversion is accomplished with the reference voltage generated from the resistor string at one stage being used through a full scale adjusting amplifier having the same amplifying characteristics, e.g. gain, as the error amplifier, to be applied to the next stage, even when the amplifiers have low gain and the voltage divisions are not uniform.

The AD converters have been analyzed with respect to a further problem of an analog switch resisting proper operation when it is operating at a low power supply voltage It is a problem that the supply voltage may be lowered sufficiently that one of the analog switches will not operate properly. When supply voltage is lowered, the gate voltage of a MOS transistor that is used as a switch also lowers and consequently the on resistance increases. Moreover, the switch will not be turned on when the supply voltage is too low. The on resistance of the MOS transistor is determined by the voltage resulting from the difference between the source and gate potentials of the transistor. In case of a digital circuit, the gate to source voltage can be set at the same level of the supply voltage Vdd in circuits in general, since the source potential can be ground or supply voltage Vdd. In the case of an analog circuit, on the other hand, the source potential often remains at an input analog signal level. Since the input analog signal is at Vdd/2 on the average, the voltage applied between the gate and the source is on the average at Vdd/2. Therefore, the on resistance is higher in an analog circuit than it is in a digital circuit and moreover the switch is not turned on as the supply voltage lowers.

To solve this problem or potential problem, according to a further detail of the present invention, the analog switches are provided with a high supply voltage. As shown in FIG. 12, and as described previously, each of the switches is provided with an independent high voltage source 6 of HV, preferably from outside of the AD converter, which AD converter is preferably contained entirely on a single chip to present a one chip circuit. Alternatively, the chip or circuit of the AD converter may be provided with a voltage generator to generate the high voltage to be supplied to all of the analog switches of the stages. Therefore, FIG. 13 illustrates a circuit that is the same as that of FIG. 12, but with the high voltage source 7 of step up voltage S-W being inside the single chip that contains the entire AD converter circuit.

Instead of providing separate high voltage sources as in FIGS. 12 and 13, the analog switches may be low threshold voltage analog switches 8, as in FIG. 14 so that even when the supply voltage is low from the residue signal of the preceeding stage, the switches will still operate satisfactorily.

Figure 16:
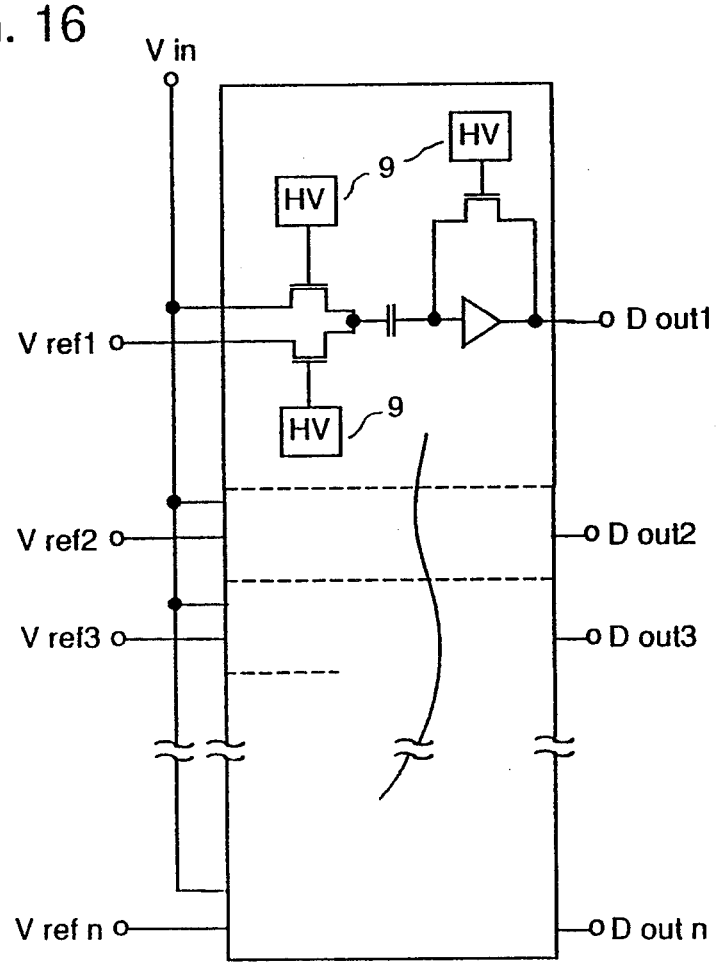
FIG. 16 is a diagram illustrating a parallel AD converter using a comparator employing a high voltage clock circuit, a step-up clock circuit or a low threshold voltage transistor for the power supply of a switch.
Figure 17:
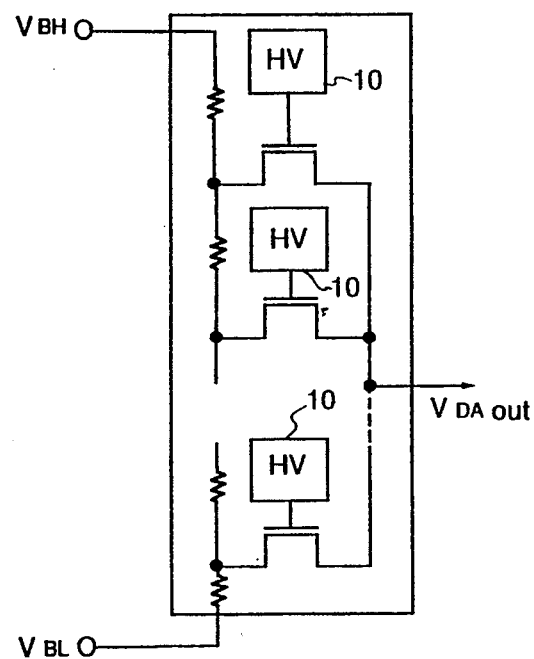
FIG. 17 is a diagram of a low voltage DA converter using a high voltage for a switch according to the present invention.

While the features specific to FIGS. 12 and 13 are particularly advantageous in an analog to digital converter in the present invention they have a broader aspect. That is, the use of a separate, outside or internally generated, high voltage supply HV for analog switches in a comparator and a general purpose single chip AD converter is shown in FIG. 15 and FIG. 16, respectively, where the high voltage supply HV is a high voltage circuit or a Step-up circuit for generating voltage higher than the supply voltage Vdd of any other circuit component of the AD converter, as the power supply for the analog switch or switches of the AD converter. A plurality of such high voltage circuits HV 9 are arranged in rows as shown in FIG. 16 to provide a parallel AD converter for low voltage use. This one-chip parallel AD converter of FIG. 16 may also be used for the sub AD converters 1-2 and 2-1 shown in FIGS. 1, 2, 4, 5, 7-14 of the pipelined AD converter, or the serial-parallel or subrange AD converter. A similar high voltage circuit HV 10 may also be used with an analog switch for the DA converter 1-2 in FIGS. 1, 2, 4, 5, 7-14 to provide a DA converter for low voltage use as shown in FIG. 17. Similarly, the high voltage circuit or step-up power supply may be used for an analog switch in the switched capacitor amplifier or the switched capacitor circuit in general to provide a circuit for low voltage use, apart from any DA converter.

According to the present invention, an AD converter is provided for use at low supply voltage. A problem arising from using an error amplifier of finite or low gain and bandwidth is solved by a resistor string at the first stage generating a reference voltage that is adjusted by a full scale adjusting amplifier having the same characteristics as the error amplifier in order to carry out accurate AD conversion in a subsequent stage. Moreover, another problem arising from the use of an analog switch which may not be turned on because of a low voltage supply can be solved by raising the gate voltage or using a low threshold voltage transistor. Therefore, an efficient AD converter is obtained, even at low voltage, according to the present invention.

While a preferred embodiment has been described in detail, other embodiments variations and modifications are contemplated according to the spirit and scope of the present invention.

We claim:

1. An AD converter in the form of a serial-parallel or pipelined AD converter for low-voltage application to convert a beginning analog signal to a final digital signal, comprising:
   a plurality of function blocks, each operating as a stage of AD conversion;
   each of said blocks comprising a sub AD converter having a reference voltage, an analog signal input and a digital output;
   each of said blocks further comprising a DA converter inputting the digital output and outputting an analog signal output, and an error amplifier comparing the analog signal input and the analog signal output to produce an amplified analog differential residue signal;
   said blocks being connected as means for AD conversion of the beginning analog signal input to said sub AD converter of a first stage of the stages of AD conversion for providing the digital output of each of said blocks as at least one bit of the final digital signal, and providing the amplified analog differential residue signal of each of said blocks having a next block of the stage of AD conversion as the analog signal input of the next block;
   said sub AD converter in each block at a second and following ones of the stages of AD conversion having a voltage divider, a full scale adjusting amplifier means for generating and adjusting a reference voltage to be substantially equal in full scale to a full output range of said error amplifier of a preceding stage of AD conversion and for supplying the reference voltage across said voltage divider; and
   said full scale adjusting amplifier means having an amplifier that is identical in circuit construction type to said error amplifier and inputs one voltage step of the voltage divider in the block at a preceding one of the stages of AD conversion.

2. An AD converter as claimed in claim 1, wherein said error amplifier and the amplifier of said full scale adjusting amplifier means are switched capacitor amplifiers.

3. An AD converter as claimed in claim 2, wherein said switched capacitor amplifiers are each a CMOS inverted amplifier.

4. An AD converter as claimed in claim 2, wherein said switched capacitor amplifiers are each an inverted amplifier using a constant current source load.

5. An AD converter as claimed in claim 2, contained on a single integrated circuit, wherein said switched capacitor amplifiers have analog MOS switches with a threshold voltage lower than a threshold voltage of any transistors in said integrated circuit except analog MOS switches.

6. An AD converter as claimed in claim 1, wherein said full scale adjusting amplifier means is provided with reset means for supplying the reference voltage as a reset voltage to said voltage divider.

7. An AD converter as claimed in claim 1, wherein, said full scale adjusting amplifier means has a switching circuit responsive to the digital output for obtaining input voltage to said full scale adjusting amplifier means by switching voltage across terminals of said voltage divider at the preceding one of the stages of AD conversion.

8. An AD converter of claim 1, wherein said error amplifier is a differential amplifier with a finite low gain and said full scale adjusting amplifier means amplifies a division of the reference voltage of the preceding one of the stages of AD conversion with substantially the finite low gain of said error amplifier.

9. An AD converter of claim 1, wherein said voltage divider is a resistor string.

10. An AD converter of claim 1, entirely constructed on a single integrated chip to provide a one chip circuit.

11. An AD converter of claim 1, wherein said error amplifier and said full scale adjusting amplifier means are switched capacitor differential amplifiers having a plurality of analog switches for resetting during a reset period and feeding signals to the switched capacitor differential amplifiers during an amplifying period; and
   amplifier of said full scale adjusting amplifier means having full scale amplifiers and said analog switches for switching an output of at least one full scale amplifier to said voltage divider of a next stage of the stages of AD conversion during the amplifying period and for switching a bias voltage to the voltage divider of the next stage during the reset period.

12. An AD converter of claim 11, further including means providing the bias voltage as a fixed voltage.

13. An AD converter of claim 11, further including means providing the bias voltage as a variable voltage derived from an amplified voltage of the voltage divider of the preceding one of the stages of AD conversion.

14. An AD converter of claim 1, wherein said full scale adjusting amplifier means include a selector having inputs connected to receive voltage divisions of said voltage divider of the preceding one of the stages of AD conversion as inputs; and said selector being responsive to the digital output of said sub AD converter of the preceding one of the stages of AD conversion for feeding a selected one of the inputs to said amplifier of said full scale adjusting amplifier means.

15. An AD converter in the form of a serial-parallel or pipelined AD converter, which is contained on an single integrated circuit, for low-voltage application to convert a beginning analog signal to a conversion digital output, comprising:

a plurality of function blocks, each operating as a stage of conversion;

each of said blocks comprising a sub AD converter having a reference voltage, a voltage divider providing the reference voltage, an analog signal input and a digital output;

each of said blocks further comprising a DA converter inputting the digital output of said sub AD converter and outputting an analog signal output, and an error amplifier comparing the analog signal input to the analog signal output to produce an amplified analog differential residue signal;

said blocks each being means for AD conversion of the beginning analog signal as the analog signal input at a first of the stages of AD conversion, for providing at least one bit of the conversion digital output as the digital output, and for AD conversion of the amplified analog differential residue signal fed from a preceding one of the stages of AD conversion as the analog signal input at the stages other than the first of the stages of AD conversion; and said error amplifiers each being a switched capacitor amplifier having analog MOS switches with a gate control voltage higher than power supply voltage of the integrated circuit.

16. An AD converter as claimed in claim 15, further comprising means for providing the gate control voltage higher than the power supply voltage of the integrated circuit.

17. An AD converter as claimed in claim 16, wherein said means for providing the gate control voltage is a built-in step-up circuit.

18. An AD converter in the form of a serial-parallel or pipelined AD converter for low-voltage application to convert a beginning analog signal to a final digital signal, comprising:

a plurality of function blocks, each operating as a stage of AD conversion;

each of said blocks comprising a sub AD converter having a reference voltage, an analog signal input and a digital output;

each of said blocks further comprising a DA converter inputting the digital output and outputting an analog signal output, and an error amplifier comparing the analog signal input and the analog signal output to produce an amplified analog differential residue signal;

said blocks being connected as means for AD conversion of the beginning analog signal input to said sub AD converter of a first stage of the stages of AD conversion for providing the digital output of each of said blocks as at least one bit of the final digital signal, and providing the amplified analog differential residue signal of each of said blocks having a next block of the stage of AD conversion as the analog signal input of the next block;

said sub AD converter in each block at a second and following ones of the stages of AD conversion having a voltage divider, a full scale adjusting amplifier means for generating and adjusting a reference voltage to be substantially equal in full scale to a full output range of said error amplifier of a preceding stage of AD conversion and for supplying the reference voltage across said voltage divider; and said full scale adjusting amplifier means having an amplifier that operates within the same circuit characteristics as said error amplifier and inputs one voltage step of the voltage divider in the block at a preceding one of the stages of AD conversion.

19. An AD converter as claimed in claim 18, wherein said error amplifier and the amplifier of said full scale adjusting amplifier means are switched capacitor amplifiers.

20. An AD converter as claimed in claim 19, wherein said switched capacitor amplifiers are each a CMOS inverted amplifier.

21. An AD converter as claimed in claim 19, wherein said switched capacitor amplifiers are each an inverted amplifier using a constant current source load.

* * * * *